United States Patent [19]
Chan et al.

[11] Patent Number: 6,124,765
[45] Date of Patent: *Sep. 26, 2000

[54] INTEGRATED RELEASED BEAM OSCILLATOR AND ASSOCIATED METHODS

[75] Inventors: Tsiu Chiu Chan, Dallas; Melvin Joseph DeSilva; Syama Sundar Sunkara, both of Collin, all of Tex.

[73] Assignee: STMicroelectronics, Inc., Carrollton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/957,804

[22] Filed: Oct. 24, 1997

[51] Int. Cl.$^7$ ..................................................... H01L 41/08
[52] U.S. Cl. ................... 331/116 M; 331/176; 331/183; 331/108 C; 331/65; 331/47; 331/154; 257/415; 368/156
[58] Field of Search ...................................... 331/154, 156, 331/116 M, 47, 48, 52, 65, 183, 108 C, 176; 257/415; 73/773; 368/202, 155, 156; 968/900

[56] References Cited

U.S. PATENT DOCUMENTS

| | | | |
|---|---|---|---|
| 3,766,616 | 10/1973 | Staudte | 29/25.35 |
| 3,969,640 | 7/1976 | Staudte | 310/9.1 |
| 4,272,840 | 6/1981 | Morozumi et al. | 368/202 |
| 4,320,320 | 3/1982 | Momosaki et al. | 310/361 |
| 4,443,116 | 4/1984 | Yoshida et al. | 368/202 |
| 4,464,061 | 8/1984 | Kamiya | 368/202 |
| 5,198,716 | 3/1993 | Godshall et al. | 310/349 |
| 5,417,312 | 5/1995 | Tsuchitani et al. | 188/181 |
| 5,444,641 | 8/1995 | White | 364/484 |
| 5,506,454 | 4/1996 | Hanzawa et al. | 307/10.1 |
| 5,559,358 | 9/1996 | Burns et al. | 257/431 |
| 5,576,251 | 11/1996 | Garabedian et al. | 437/228 |
| 5,578,843 | 11/1996 | Garabedian et al. | 257/254 |
| 5,610,335 | 3/1997 | Shaw et al. | 73/514.36 |
| 5,610,337 | 3/1997 | Nelson | 73/651 |
| 5,640,133 | 6/1997 | MacDonald et al. | 333/197 |
| 5,659,195 | 8/1997 | Kaiser et al. | 257/415 |

*Primary Examiner*—Arnold Kinkead
*Attorney, Agent, or Firm*—Theodore E. Galanthay; Lisa K. Jorgenson; Christopher F. Regan

[57] ABSTRACT

An integrated oscillator and associated methods are provided for providing clock signals. The integrated oscillator preferably includes a micro-mechanical oscillating circuit for providing an oscillating clock signal. The micro-mechanical oscillating circuit preferably includes a support layer, a fixed layer positioned on a support layer, remaining portions of a sacrificial layer positioned only on portions of the fixed layer, and an oscillating layer positioned on the remaining portions of the sacrificial layer, overlying the fixed layer in spaced relation therefrom, and extending lengthwise generally transverse to a predetermined direction for defining a released beam for oscillating at a predetermined frequency. The spaced relation is preferably formed by removal of unwanted portions of the sacrificial layer. The integrated oscillator also preferably includes a clock signal controlling circuit connected to the micro-mechanical oscillating circuit for controlling the micro-mechanical oscillating circuit and for generating clock signals therefrom.

67 Claims, 8 Drawing Sheets

INTEGRATED RELEASED BEAM OSCILLATOR AND ASSOCIATED METHODS

FIELD OF THE INVENTION

The present invention relates to the field of integrated circuits, and, more particularly, to an integrated circuit and method having oscillating capability.

BACKGROUND OF THE INVENTION

Electronic clocks or timekeepers which use oscillators controlled by quartz crystal vibrators to generate timing signals are widely known. These oscillators which are controlled by quartz crystal vibrators, however, have frequencies that vary in response to temperature changes, process variations, and aging. Various techniques associated with these oscillators have been developed for compensating for temperature and process variation and for aging. These oscillators, however, are often still expensive, often consume much more power than desired, and often fail to be as accurate as desired. Also, these oscillators are often not compatible with other integrated circuit manufacturing processes, such as those associated with very large scale integration ("VLSI") and complimentary metal oxide semiconductor ("CMOS") processes.

Capacitive based tunable micro-mechanical resonators or oscillators are also known. An example is shown in U.S. Pat. No. 5,640,133 by MacDonald et al. titled *"Capacitance Based Tunable Micro-mechanical Resonators."* The resonator illustrated in this patent includes a mechanically movable component which is suspended for motion with respect to a substrate. The movable component is a microelectromechanical ("MEM") elongate beam and includes laterally extending flexible arms which suspend the beam and mount the beam to an adjacent substrate. This resonator, however, includes complex electrostatic actuators for quickly tuning the resonance of the mechanical structure, can be expensive to manufacture, and is not practical for many applications.

SUMMARY OF THE INVENTION

With the foregoing in mind, the present invention advantageously provides an integrated oscillator and associated methods which are compatible with existing semiconductor manufacturing technology. The present invention also advantageously provides an integrated oscillator and methods having a greater tolerance for small critical dimensions. The present invention additionally provides a cost effective method of forming an integrated oscillator, such as for timekeeping applications, and increases the process yield of fully released resonating beams. The present invention further advantageously provides an integrated oscillator which eliminates the need for an external crystal oscillator and the packaging costs associated therewith. The present invention still further advantageously provides an integrated oscillator which has improved accuracy over quartz crystal oscillators.

More particularly, an integrated oscillator for providing clock signals preferably includes micro-mechanical oscillating means for providing an oscillating clock signal. The micro-mechanical oscillating means preferably includes a fixed conductive layer and an oscillating conductive layer overlying the fixed conductive layer in spaced relation therefrom and extending lengthwise generally transverse to a predetermined direction for defining a released beam for oscillating at a predetermined frequency. The released beam advantageously can include a plurality of openings formed therein. The plurality of openings extend from an upper surface of the released beam to a region defining the spaced relation underlying the released beam and positioned between the released beam and the fixed conductive layer. The release beam can also include trimmed released portions defining peripheries of removed portions of the oscillating layer. Clock signal controlling means is connected to the micro-mechanical oscillating means for controlling the micro-mechanical oscillating means and for generating clock signals therefrom. The clock signal controlling means preferably includes a first electrode connected to the fixed conductive layer and a second electrode connected to the oscillating conductive layer so that the fixed conductive layer and the oscillating conductive layer provide a capacitive-type field when a voltage signal is applied to the first and second electrodes.

According to another aspect of the present invention, the integrated oscillator preferably includes micro-mechanical oscillating means for providing an oscillating clock signal. The micro-mechanical oscillating means preferably includes a support layer, a fixed layer positioned on a support layer, remaining portions of a sacrificial layer positioned on portions of the fixed layer, and an oscillating layer positioned on the remaining portions of the sacrificial layer, overlying the fixed layer in spaced relation therefrom, and extending lengthwise generally transverse to a predetermined direction for defining a released beam for oscillating at a predetermined frequency. The spaced relation is preferably formed by removal of unwanted portions of the sacrificial layer. The integrated oscillator also preferably includes clock signal controlling means connected to the micro-mechanical oscillating means for controlling the micro-mechanical oscillating means and for generating clock signals therefrom.

According to yet another aspect of the present invention, an integrated oscillator for providing clock signals preferably includes first and second micro-mechanical oscillating means each for providing an oscillating clock signal and clock signal controlling means connected to the first and second micro-mechanical oscillating means for controlling each of the first and second micro-mechanical oscillating means and for generating respective clock signals therefrom. The clock signal controlling means preferably includes a first pair of electrodes connected to the first micro-mechanical oscillating means, a second pair of electrodes connected to the second micro-mechanical oscillating means, and aging compensating means responsive to both the first and second micro-mechanical oscillating means for compensating for aging of the first micro-mechanical oscillating means by using the oscillating frequency of the second micro-mechanical means as a reference frequency.

The present invention also includes methods of forming an integrated oscillator. A method preferably includes providing a clock signal controlling circuit region and forming a micro-mechanical oscillating region connected to the clock signal controlling circuit region. The micro-mechanical oscillating region is preferably formed by at least forming a first fixed conductive layer of material on a support, depositing a sacrificial layer on the first conductive layer, depositing a second conductive layer on the sacrificial layer, and removing at least unwanted portions of the sacrificial layer underlying the second conductive layer to release the second conducting layer to thereby define a released beam overlying the fixed conducting layer for oscillating at a predetermined frequency.

Another method of forming an integrated oscillator preferably includes providing a clock signal controlling circuit region and forming a micro-mechanical oscillating region connected to the clock signal controlling circuit region. The micro-mechanical oscillating region is preferably formed by at least forming a first fixed conductive layer of material on a support, forming a second conductive layer overlying and in spaced relation from the fixed conductive layer so as to define a released beam for oscillating at a predetermined resonant frequency, and trimming portions of the released beam to reduce mass of the released beam so as to tune the predetermined resonant frequency thereof.

The method can also include the micro-mechanical oscillating region further including forming remaining portions of a sacrificial layer on the first conductive layer and underlying the second conductive layer. The step of forming the second conductive layer can include forming a plurality of openings extending through the second conductive layer. The method can still further include removing at least unwanted portions of the sacrificial layer underlying the second conductive layer to release the second conductive layer to thereby define the released beam overlying the fixed conductive layer. The remaining portions of the sacrificial layer preferably define at least one support for the released beam, and the trimming step preferably includes laser trimming portions of the released beam adjacent the support.

An additional method of forming an integrated oscillator preferably includes providing first and second micro-mechanical oscillating circuits, controlling each of the first and second micro-mechanical oscillating circuits to generate respective clock signals therefrom, and compensating for aging of the first micro-mechanical oscillating means responsive to the oscillating frequency of the second micro-mechanical oscillating means.

The method can also advantageously include compensating for the amplitude variations of the predetermined oscillating frequency of each of the first and second micro-mechanical oscillating circuits over time. The method can further include locking on the predetermined oscillating frequency of the first and second micro-mechanical oscillating circuits and compensating both for frequency shifting due to temperature variations and for a difference in oscillating frequency due to process variations.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF PREFERRED EMBODIMENTS

Figure 1:
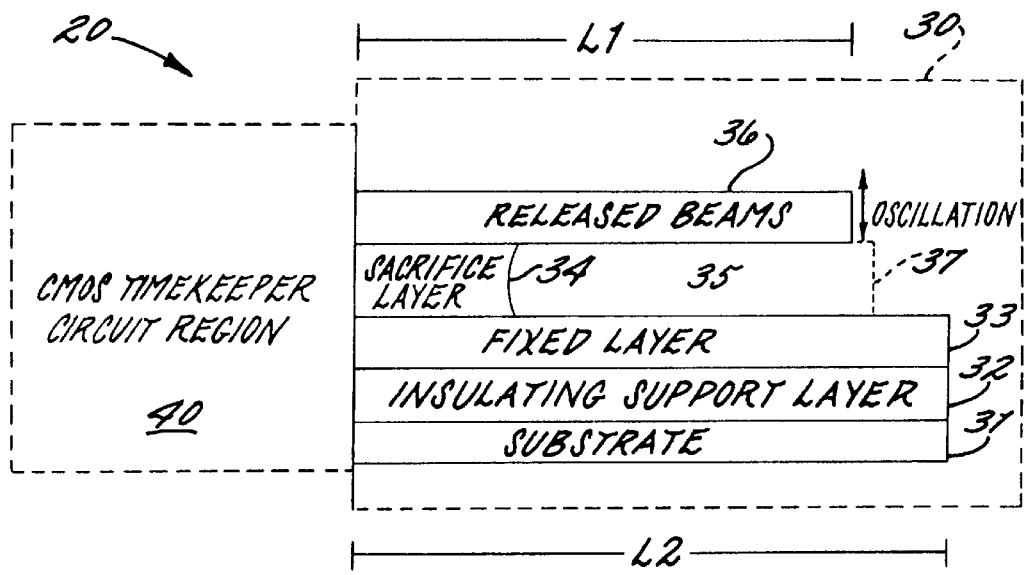
FIG. 1 is a schematic block diagram of an integrated oscillator according to a first embodiment of the present invention.

The present invention will now be described more fully hereinafter with reference to the accompanying drawings which illustrate preferred embodiments of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime, double prime, or triple prime notation, if used, indicates similar elements in alternative embodiments.

FIGS. 1–2 and 4–7 illustrate an integrated oscillator 20, e.g., a microelectromechanical integrated circuit, for producing one or more clock signals according to a first embodiment of the present invention. The integrated oscillator 20 preferably includes micro-mechanical oscillating means 30 for providing an oscillating clock signal. The micro-mechanical oscillating means 30 preferably includes a support layer 32, a fixed layer 33 positioned on the support layer 32, remaining portions 34 of a sacrificial layer 37 positioned only on portions of the fixed layer 33, and an oscillating layer 36 positioned on the remaining portions 34 of the sacrificial layer 37, overlying the fixed layer 33 in spaced relation therefrom. The sacrificial layer 37 also preferably extends lengthwise generally transverse to a predetermined direction M for defining a released beam 36 for oscillating at a predetermined frequency. The spaced relation is preferably formed by removal of unwanted portions 35 of the sacrificial layer 37. The fixed layer 33 is preferably a fixed conductive layer, and the oscillating layer 36 is preferably an oscillating conductive layer overlying the fixed conductive layer 33.

Figure 8:
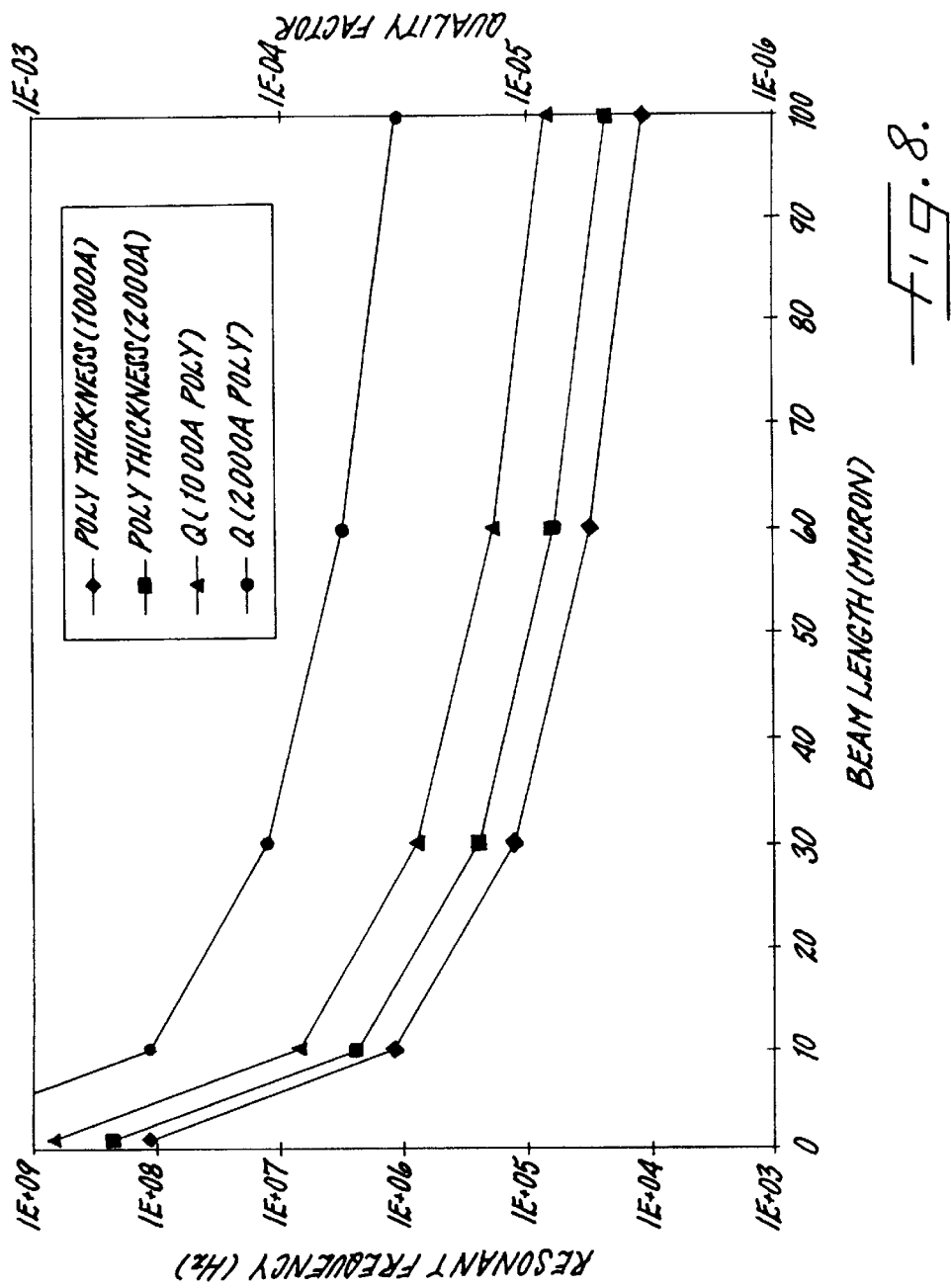
FIG. 8 is a graph illustrating resonant frequency of cantilever beams as a function of beam length of an integrated oscillator according to the present invention.

FIG. 8 graphically illustrates the resonant frequency of silicon cantilever beams as a function of beam length. This graph also illustrates the quality factor as a function of beam length. The following Table 1 shows estimated calculations for this relationship and graph shown in FIG. 8.

As shown in Table 1 and as used in the graph of FIG. 8, L is the beam length, B is the beam width, H is the beam height, f is the frequency is Hertz (HZ), Q is the quality factor which equals $(m*k)1/2b$ and where b is the viscous resistant coefficient (no.2), Den is the density of the material, m is the beam mass, I is the inertia, k is the stress factor, and E is the elasticity.

Figure 9:
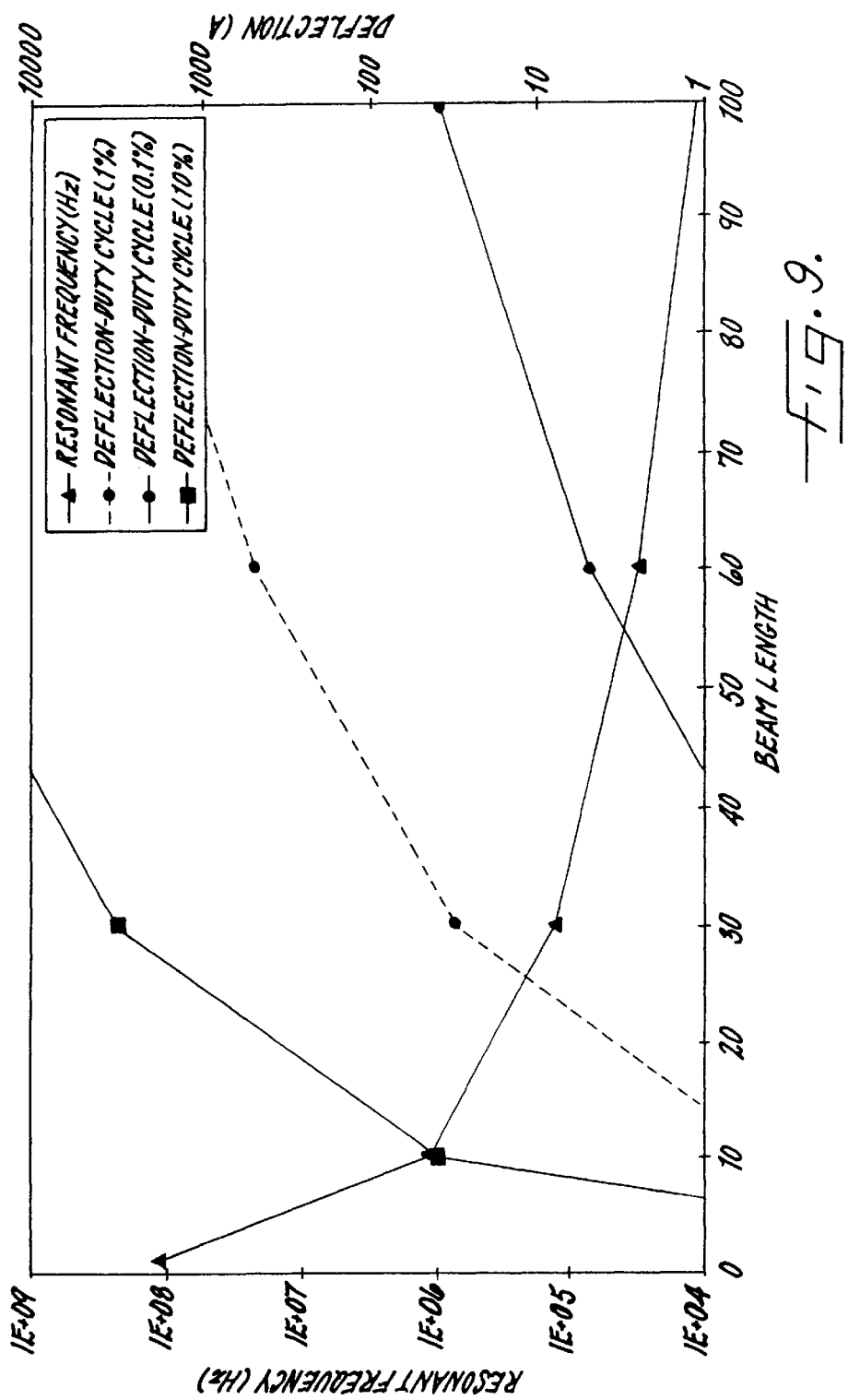
FIG. 9 is a graph illustrating resonant frequency and deflection as a function of beam length of an integrated oscillator according to the present invention.

FIG. 9 graphically illustrates the resonant frequency and the deflection of silicon cantilever beams as a function of beam length. The following Table 2 shows estimated calculations for this relationship and graph shown in FIG. 9. As shown in the Table 2 and the graph of FIG. 9, E is the elasticity of the material, Den is the density, L is the beam length, B is the beam width, H is the beam height, I is the inertia, K is a spring force constant, m is the beam mass, f is the force, def is the deflection, Q is the quality factor, V is the voltage, P2/P1 sep is the separation or spaced relation between the two layers of polysilicon, and Epsilon is a stress factor or component.

| | | Resonant Frequency of Cantilever Beams | | | | | | | | |
|---|---|---|---|---|---|---|---|---|---|---|
| | $f = ((K/m)^{0.5})/2*Pi$ | | | | $K = 8*E*I/L^3$ | | $m = den*L*b*h$ | | | |
| | $dy/cm^2$ | $gm/cm^3$ | $I = b*h^3/12$ | | | $micron^4$ | $k = E - 16\ dy/cm$ | gm | Hz | |
| Material | E | Den | L (micron) | b (micron) | h (micron) | I | K | m | f | Q |
| Si | 1.9E + 12 | 2.3 | 1 | 1 | 0.1 | 8.3333E − 05 | 1266666667 | 0.23 | 1.18E + 08 | 8.5E − 04 |
| Si | 1.9E + 12 | 2.3 | 10 | 1 | 0.1 | 8.3333E − 05 | 1266666.67 | 2.3 | 1.18E + 06 | 8.5E − 05 |
| Si | 1.9E + 12 | 2.3 | 30 | 1 | 0.1 | 8.3333E − 05 | 46913.5802 | 6.9 | 1.31E + 05 | 2.8E − 05 |
| Si | 1.9E + 12 | 2.3 | 60 | 1 | 0.1 | 8.3333E − 05 | 5864.19753 | 13.8 | 3.28E + 04 | 1.4E − 05 |
| Si | 1.9E + 12 | 2.3 | 100 | 1 | 0.1 | 8.3333E − 05 | 1266.66667 | 23 | 1.18E + 04 | 8.5E − 06 |
| Si | 1.9E + 12 | 2.3 | 1 | 1 | 0.2 | 0.00066667 | 1.0133E + 10 | 0.46 | 2.36E + 08 | 3.4E − 03 |
| Si | 1.9E + 12 | 2.3 | 10 | 1 | 0.2 | 0.00066667 | 10133333.3 | 4.6 | 2.36E + 06 | 3.4E − 04 |
| Si | 1.9E + 12 | 2.3 | 30 | 1 | 0.2 | 0.00066667 | 375308.642 | 13.8 | 2.63E + 05 | 1.1E − 04 |
| Si | 1.9E + 12 | 2.3 | 60 | 1 | 0.2 | 0.00066667 | 46913.5802 | 27.6 | 6.57E + 04 | 5.7E − 05 |
| Si | 1.9E + 12 | 2.3 | 100 | 1 | 0.2 | 0.00066667 | 10133.3333 | 46 | 2.36E + 04 | 3.4E − 05 |
| | | | L (micron) | Poly thicknes | | Poly thicknes | Q (1000A pol) | Q (2000A poly) | | |
| | | | 1 | 118170102 | | 236340203 | 0.00085342 | 0.0034137 | | |
| | | | 10 | 1181701.02 | | 2363402.03 | 8.5342E − 05 | 0.00034137 | | |
| | | | 30 | 131300.113 | | 262600.226 | 2.8447E − 05 | 0.00011379 | | |
| | | | 60 | 3.28E + 04 | | 65650.0565 | 1.4224E − 05 | 5.6895E − 05 | | |
| | | | 100 | 11817.0102 | | 23634.0203 | 8.5342E − 06 | 3.4137E − 05 | | |

| | | | | Deflection and Q-factor | | | | | | | |
|---|---|---|---|---|---|---|---|---|---|---|---|
| | | | | Deflection vs voltage of Silicon cantilevers | | | | | | | |
| | $dy/cm^2$ | $gm/cm^3$ | | | | $Cm^4$ | $dy/cm$ | gm | | micron | F/m |
| Material | E | Den | L (micron) | b (micron) | h (micron) | I | K | m | voltage | P2/P1 sep | Epsilon |
| Si | 1.9E + 12 | 2.3 | 1 | 1 | 0.1 | 8.333E − 21 | 1.267E − 07 | 0.23 | 0.05 | 0.1 | 8.85E − 12 |
| Si | 1.9E + 12 | 2.3 | 10 | 1 | 0.1 | 8.333E − 21 | 1.267E − 10 | 2.3 | 0.05 | 0.1 | 8.85E − 12 |
| Si | 1.9E + 12 | 2.3 | 30 | 1 | 0.1 | 8.333E − 21 | 4.691E − 12 | 8.9 | 0.05 | 0.1 | 8.85E − 12 |
| Si | 1.9E + 12 | 2.3 | 60 | 1 | 0.1 | 8.333E − 21 | 5.864E − 13 | 13.8 | 0.05 | 0.1 | 8.85E − 12 |
| Si | 1.9E + 12 | 2.3 | 100 | 1 | 0.1 | 8.333E − 21 | 1.267E − 13 | 23 | 0.05 | 0.1 | 8.85E − 12 |
| Si | 1.9E + 12 | 2.3 | 1 | 1 | 0.2 | 6.667E − 20 | 1.013E − 06 | 0.46 | 0.05 | 0.1 | 8.85E − 12 |
| Si | 1.9E + 12 | 2.3 | 10 | 1 | 0.2 | 6.667E − 20 | 1.013E − 09 | 4.6 | 0.05 | 0.1 | 8.85E − 12 |
| Si | 1.9E + 12 | 2.3 | 30 | 1 | 0.2 | 6.667E − 20 | 3.753E − 11 | 13.8 | 0.05 | 0.1 | 8.85E − 12 |
| Si | 1.9E + 12 | 2.3 | 60 | 1 | 0.2 | 6.667E − 20 | 4.691E − 12 | 27.6 | 0.05 | 0.1 | 8.85E − 12 |
| Si | 1.9E + 12 | 2.3 | 100 | 1 | 0.2 | 6.667E − 20 | 1.013E − 12 | 46 | 0.05 | 0.1 | 8.85E − 12 |

-continued

Deflection and Q-factor

|  |  |  |  |  | b = viscous resistance coefficient ~ 0.2 |
|---|---|---|---|---|---|
| micron P2/P1 sep | F/m Epsilon | dynes Force | def (cm) | def (A) | quality factor = (m*K)^.5/b Q |
| 0.1 | 8.85E − 12 | 1.106E − 07 | 8.734E − 13 | 8.734E − 05 | 0.0008534 |
| 0.1 | 8.85E − 12 | 1.106E − 06 | 8.734E − 09 | 0.8733553 | 8.534E − 05 |
| 0.1 | 8.85E − 12 | 3.319E − 06 | 7.074E − 07 | 70.741776 | 2.845E − 05 |
| 0.1 | 8.85E − 12 | 6.638E − 06 | 1.132E − 05 | 1131.8684 | 1.422E − 05 |
| 0.1 | 8.85E − 12 | 1.106E − 05 | 8.734E − 05 | 8733.5526 | 8.534E − 06 |
| 0.1 | 8.85E − 12 | 1.106E − 07 | 1.092E − 13 | 1.092E − 05 | 0.0034137 |
| 0.1 | 8.85E − 12 | 1.106E − 06 | 1.092E − 09 | 0.1091694 | 0.0003414 |
| 0.1 | 8.85E − 12 | 3.32E − 06 | 8.84E − 08 | 8.842722 | 0.000114 |
| 0.1 | 8.85E − 12 | 6.64E − 06 | 1.41E − 06 | 141.4836 | 5.69E − 05 |
| 0.1 | 8.85E − 12 | 1.11E − 05 | 1.09E − 05 | 1091.694 | 3.41E − 05 |

The integrated oscillator 20 also preferably includes a clock signal controlling means 40, e.g., a controller or controlling circuit, connected to the micro-mechanical oscillating means 30 for controlling the micro-mechanical oscillating means 30 and for generating clock signals therefrom. The clock signal controlling means 40 preferably includes a first electrode 41 connected to the fixed conductive layer 33 and a second electrode 42 connected to the oscillating conductive layer 36 so that the fixed conductive layer 33 and the oscillating conductive layer 36 provide a capacitive-type field when a voltage signal is applied to the first and second electrodes 41, 42.

Figure 10:
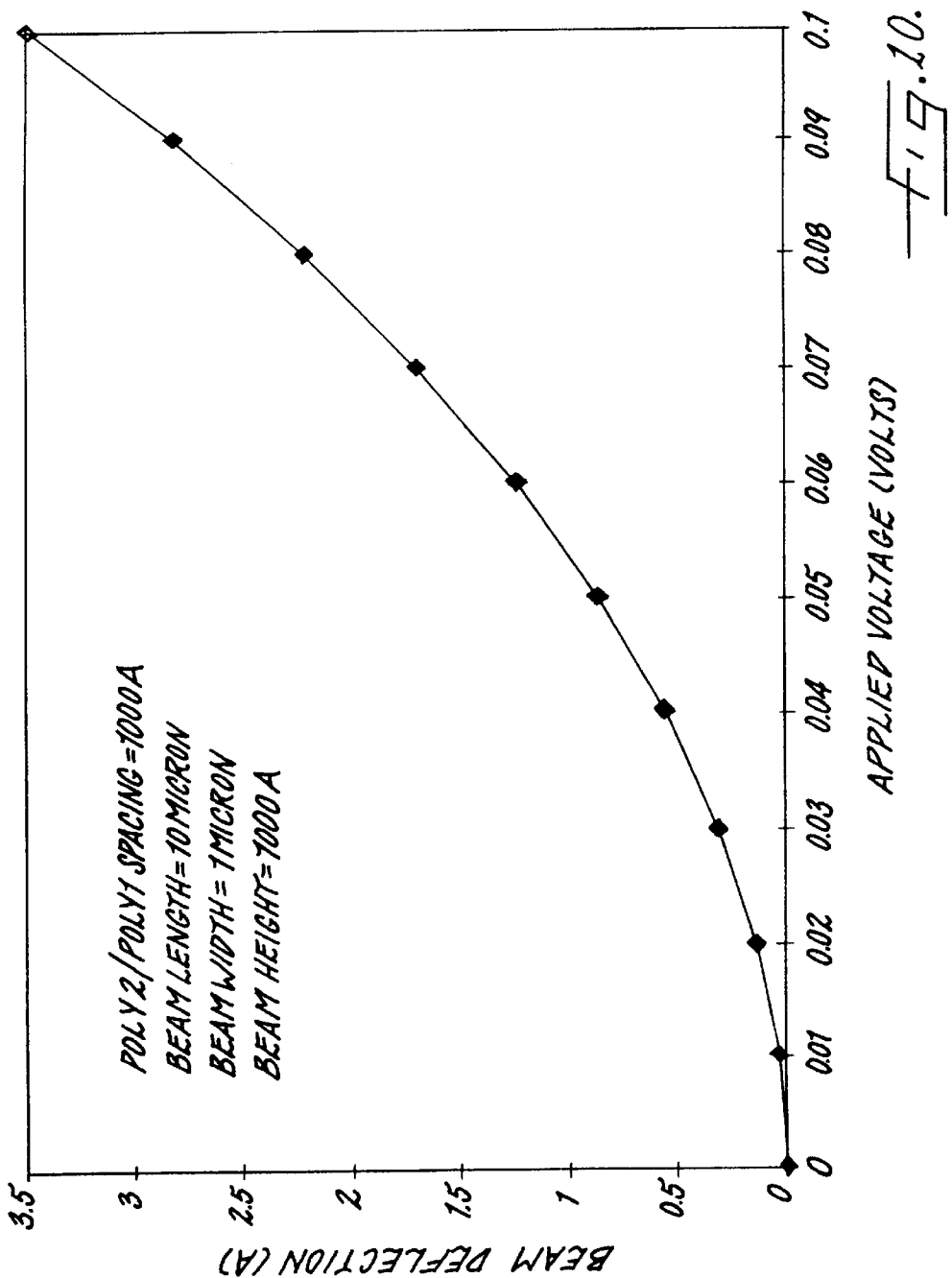
FIG. 10 is a graph illustrating cantilever beam deflection as a function of voltage according to the present invention.

FIG. 10. graphically illustrates silicon cantilever beam deflection as a function of voltage. The following Table 3 shows estimated calculations for this relationship and graph shown in FIG. 10. As shown in Table 3 and the graph, E is the elasticity, Den is the density, L is the beam length, B is the beam width, H is the beam height, I is the inertia, k is the stress factor, m is the beam mass, v is the voltage, Epsilon is a strain factor or compound, P2/P1 sep is the separation between the two polysilicon layers, def is the deflection, and capacitance is the capacitance between the two layers, and delta (cap) is the change in capacitance.

Capacitance

Deflection vs voltage of Silicon cantilevers

| Material | dy/cm^2 E | gm/cm^3 Den | L (micron) | b (micron) | h (micron) | Cm^4 I | dy/cm K | gm m | voltage | micron P2/P1 sep | F/m Epsilon |
|---|---|---|---|---|---|---|---|---|---|---|---|
| Si | 1.9E + 12 | 2.3 | 10 | 1 | 0.1 | 8.333E − 21 | 1.267E − 10 | 2.3 | 0 | 0.1 | 8.85E − 12 |
| Si | 1.9E + 12 | 2.3 | 10 | 1 | 0.1 | 8.333E − 21 | 1.267E − 10 | 2.3 | 0.01 | 0.1 | 8.85E − 12 |
| Si | 1.9E + 12 | 2.3 | 10 | 1 | 0.1 | 8.333E − 21 | 1.267E − 10 | 2.3 | 0.02 | 0.1 | 8.85E − 12 |
| Si | 1.9E + 12 | 2.3 | 10 | 1 | 0.1 | 8.333E − 21 | 1.267E − 10 | 2.3 | 0.03 | 0.1 | 8.85E − 12 |
| Si | 1.9E + 12 | 2.3 | 10 | 1 | 0.1 | 8.333E − 21 | 1.267E − 10 | 2.3 | 0.04 | 0.1 | 8.85E − 12 |
| Si | 1.9E + 12 | 2.3 | 10 | 1 | 0.1 | 8.333E − 21 | 1.267E − 10 | 2.3 | 0.05 | 0.1 | 8.85E − 12 |
| Si | 1.9E + 12 | 2.3 | 10 | 1 | 0.1 | 8.333E − 21 | 1.267E − 10 | 2.3 | 0.06 | 0.1 | 8.85E − 12 |
| Si | 1.9E + 12 | 2.3 | 10 | 1 | 0.1 | 8.333E − 21 | 1.267E − 10 | 2.3 | 0.07 | 0.1 | 8.85E − 12 |
| Si | 1.9E + 12 | 2.3 | 10 | 1 | 0.1 | 8.333E − 21 | 1.267E − 10 | 2.3 | 0.08 | 0.1 | 8.85E − 12 |
| Si | 1.9E + 12 | 2.3 | 10 | 1 | 0.1 | 8.333E − 21 | 1.267E − 10 | 2.3 | 0.09 | 0.1 | 8.85E − 12 |
| Si | 1.9E + 12 | 2.3 | 10 | 1 | 0.1 | 8.333E − 21 | 1.267E − 10 | 2.3 | 0.1 | 0.1 | 8.85E − 12 |

| micron P2/P1 sep | F/cm Epsilon | dynes Force | b = viscous resistance coefficient ~ 0.2 | | | |
|---|---|---|---|---|---|---|
|  |  |  | def (cm) | def (A) | capacitanc | delta (cap) |
| 0.1 | 8.85E − 12 | 0 | 0 | 0 | 8.85E − 14 | 0 |
| 0.1 | 8.85E − 12 | 4.43E − 08 | 3.49E − 10 | 0.034934 | 8.85E − 14 | 1.55E − 18 |
| 0.1 | 8.85E − 12 | 1.77E − 07 | 1.4E − 09 | 0.139737 | 8.85E − 14 | 4.64E − 18 |
| 0.1 | 8.85E − 12 | 3.98E − 07 | 3.14E − 09 | 0.314408 | 8.85E − 14 | 7.73E − 18 |
| 0.1 | 8.85E − 12 | 7.08E − 07 | 5.59E − 09 | 0.558947 | 8.85E − 14 | 1.08E − 17 |
| 0.1 | 8.85E − 12 | 1.11E − 06 | 8.73E − 09 | 0.873355 | 8.85E − 14 | 1.39E − 17 |
| 0.1 | 8.85E − 12 | 1.59E − 06 | 1.26E − 08 | 1.257632 | 8.84E − 14 | 1.7E − 17 |
| 0.1 | 8.85E − 12 | 2.17E − 06 | 1.71E − 08 | 1.711776 | 8.84E − 14 | 2.01E − 17 |
| 0.1 | 8.85E − 12 | 2.83E − 06 | 2.24E − 08 | 2.235789 | 8.84E − 14 | 2.31E − 17 |
| 0.1 | 8.85E − 12 | 3.58E − 06 | 2.83E − 08 | 2.829671 | 8.84E − 14 | 2.62E − 17 |
| 0.1 | 8.85E − 12 | 4.43E − 06 | 3.49E − 08 | 3.493421 | 8.83E − 14 | 2.93E − 17 |

The clock signal controlling means 40 also includes a clock signal controlling circuit region. The micro-mechanical oscillating means 30 is preferably positioned adjacent the clock signal controlling circuit region and transversely extends outwardly therefrom in a predetermined direction M. The released beam 36 of the micro-mechanical oscillating means 30 has a first predetermined length L1 extending outwardly from the clock signal controlling circuit region 40. The fixed conductive layer 33 also extends outwardly from the clock signal controlling circuit region 40 a second predetermined length L2. The second predetermined length L2 is preferably greater than the first predetermined length L1.

Figure 2:
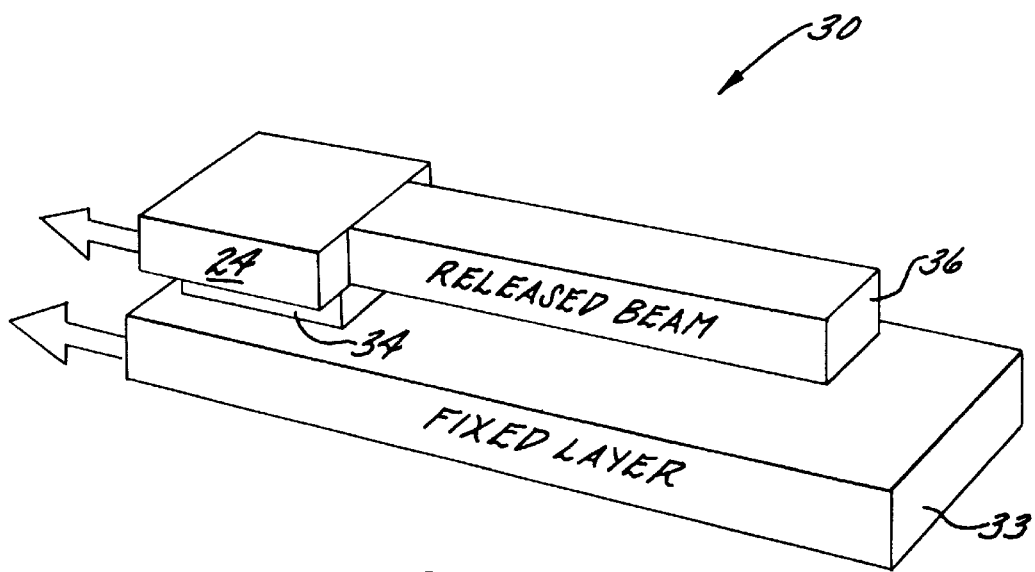
FIG. 2 is an isometric view of a micro-mechanical oscillating circuit of an integrated oscillator according to a first embodiment of the present invention.
Figure 3:
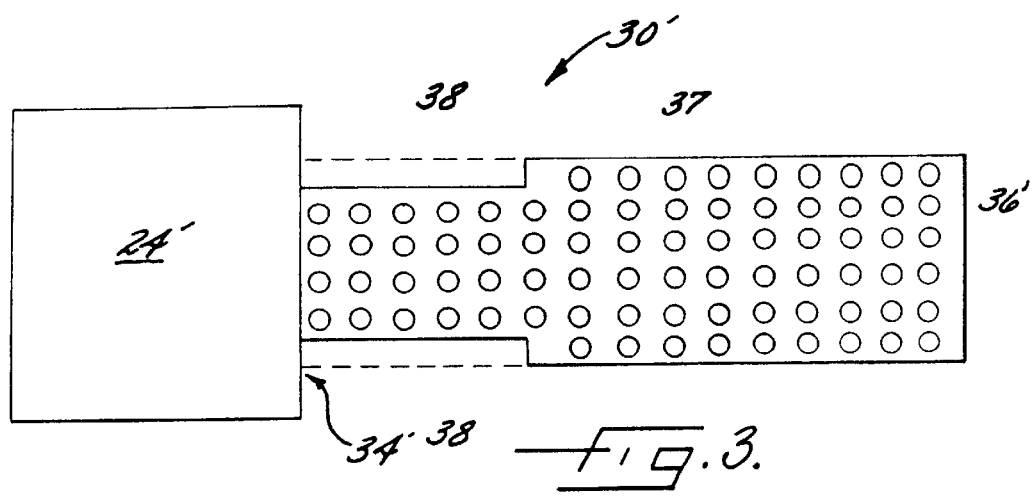
FIG. 3 is a top plan view of a released beam of a micro-mechanical oscillating circuit of an integrated oscillator according to a second embodiment of the present invention.
Figure 11:
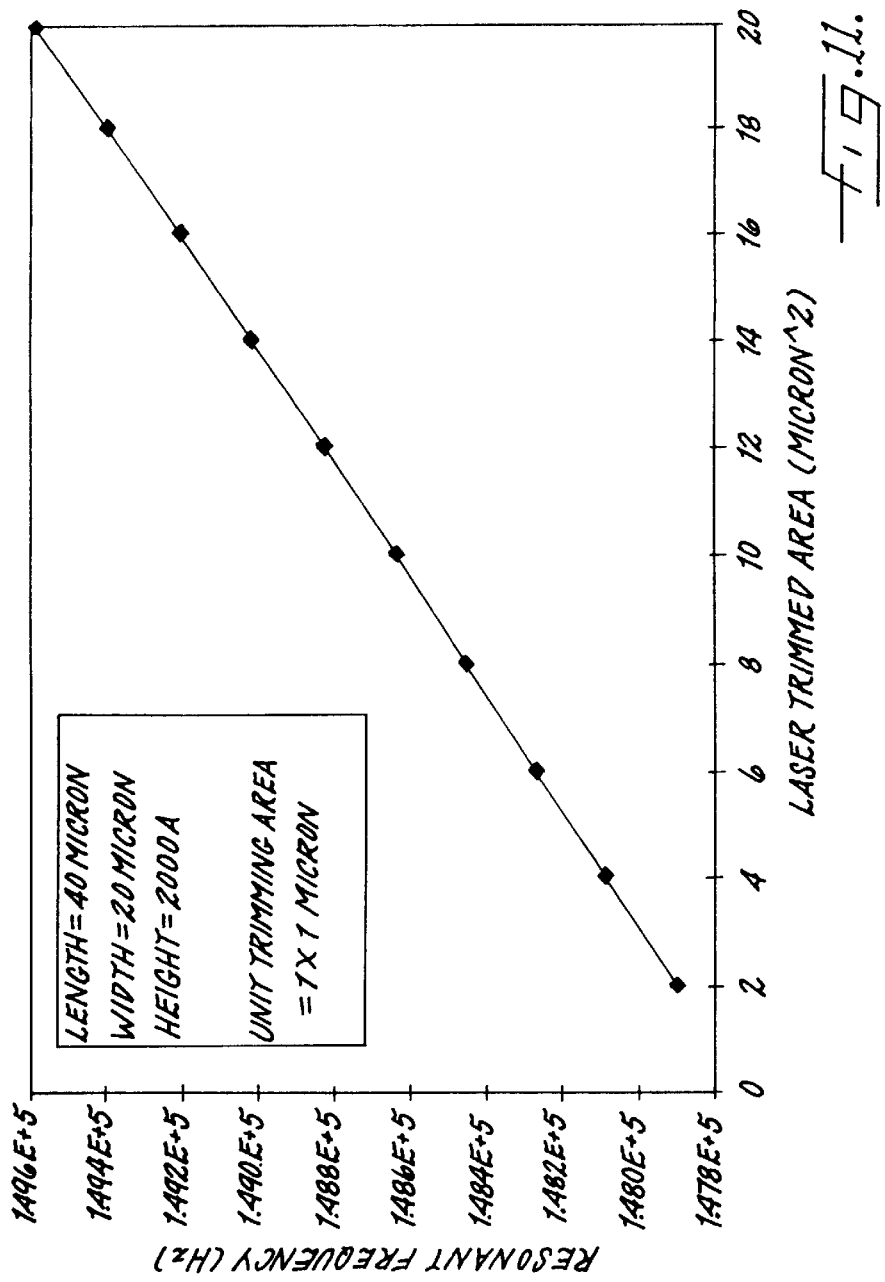
FIG. 11 is a graph illustrating resonant frequency modification of beams by mass reduction using laser trimming of an integrated oscillator according to a second embodiment of the present invention.

As perhaps best illustrated in FIGS. 3 and 11, the released beam 36 can also include a plurality of openings 39 formed therein for assisting with removal of the unwanted portions 35 of the sacrificial layer 37 underlying the released beam 36. The plurality of openings 39 preferably extend from an upper surface of the released beam 36 to a region defining the spaced relation underlying the released beam 36 and positioned between the released beam 36 and the fixed conducting layer 33. The openings, for example, can be formed by various known etching techniques as understood by those skilled in the art. The sacrificial layer 37 preferably includes at least one concave surface underlying the released beam 36 (see FIGS. 1–2).

The released beam 36 also includes trimmed released portions 38 thereof. The trimmed released portions 38 preferably define peripheries of removed portions of the oscillating layer 36. The trimmed released portions 38 of the released beam 36 preferably define narrow portions of the beam 36. The beam 36 also includes laterally extending wide portions integrally formed as a single layer with and extending outwardly from the narrow portions.

FIG. 11 graphically illustrates resonant frequency modification of cantilever beams by mass reduction using laser trimming to trim away unwanted portions of the released beam 36'. The following Table 4 shows estimated calculations for these relationships and graph shown in FIG. 11. In Table 4 and the graph, E is the elasticity, Den is the density, L is the beam length, B is the beam width, H is the beam height, I is the inertia, k is the stress factor, m is the beam mass, f is the resonant frequency, Q is the quality factor, L1 is the length trimmed from the beam, B1 is the width trimmed from the beam, m1 is the change in mass, and f1 is the trimmed frequency.

Sheet 1

Reasonant Frequency of Cantilevel Beams $f = ((K/m)^{0.5})/2*Pi$   $K = 8*E*I/L^3$   $m = den * L *b *h$

| Material | E dy/cm^2 | Den gm/cm^3 | L (micron) | b (micron) | h (micron) | I = b*h^3/12 micron^4 | K k = E-16dy/cm | m gm | f Hz | Q |
|---|---|---|---|---|---|---|---|---|---|---|
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166867 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |
| Si | 1.90E + 12 | 2.3 | 40 | 20 | 0.2 | 0.01333 | 3166667 | 368 | 1.48E + 5 | 1.7E − 03 |

Laser trimming

| length trimmed L1 (micro) | width trimmed b1 (micro) | mass change m1 | trimmed frequency f1 |
|---|---|---|---|
| 1 | 2 | 3.67E + 02 | 1.48E + 05 |
| 2 | 2 | 3.66E + 02 | 1.48E + 05 |
| 3 | 2 | 3.65E + 02 | 1.48E + 05 |
| 4 | 2 | 3.64E + 02 | 1.48E + 05 |
| 5 | 2 | 3.63E + 02 | 1.49E + 05 |
| 6 | 2 | 3.62E + 02 | 1.49E + 05 |
| 7 | 2 | 3.62E + 02 | 1.49E + 05 |
| 8 | 2 | 3.61E + 02 | 1.49E + 05 |
| 9 | 2 | 3.60E + 02 | 1.49E + 05 |
| 10 | 2 | 3.59E + 02 | 1.50E + 05 |

Figure 4:
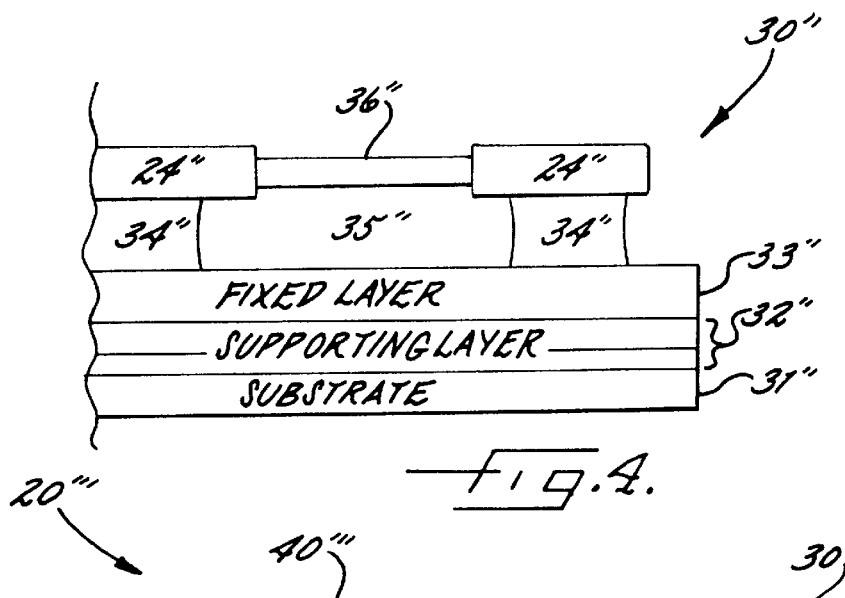
FIG. 4 is a side elevational view of a micro-mechanical oscillating circuit according to a third embodiment of the present invention.
Figure 5:
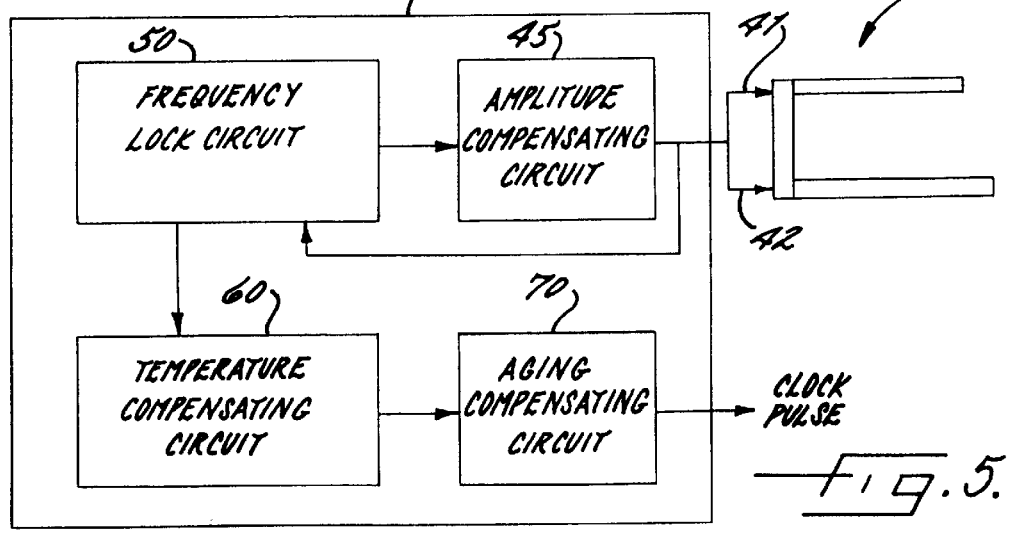
FIG. 5 is a schematic block diagram of an integrated oscillator according to a first embodiment of the present invention.
Figure 6:
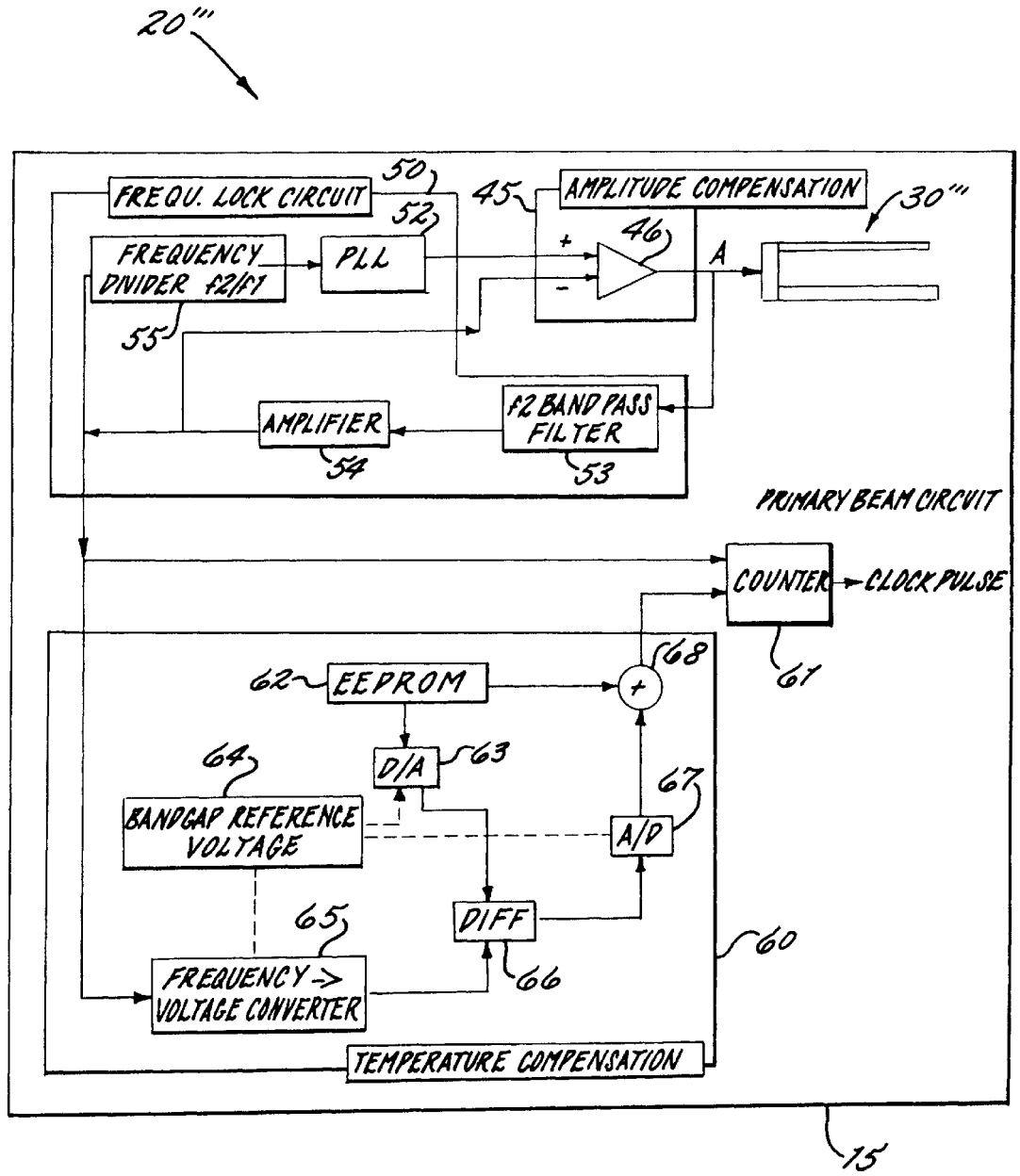
FIG. 6 is a schematic block diagram of an amplitude compensator, a frequency lock circuit, and a temperature compensator of a timekeeper circuit region of an integrated oscillator according to a fourth embodiment of the present invention.

As illustrated in FIGS. 1–3, the released beam 36 is preferably a released cantilever beam. Alternatively, as illustrated in FIG. 4, for example, the released beam 36" can be a released beam having a plurality of supports formed by the remaining portions 24" of the sacrificial layer 37".

The fixed conductive layer 33 is preferably formed of at least one of polysilicon and a metal, and the released beam 36 is also preferably formed of either polysilicon or a metal. The micro-mechanical oscillating means 30 further includes the support layer 32 being formed of an insulating material underlying the fixed conducting layer 33. The insulating support layer 32, for example, can be a nitride layer formed on a field oxide. The sacrificial layer 37 is preferably an oxide layer, e.g., silicon dioxide ($SiO_2$).

As illustrated in FIGS. 4–7, the clock signal controlling means 40 preferably includes amplitude compensating means 45 connected to the micro-mechanical oscillating means 30 for compensating for the amplitude variations of the predetermined oscillating frequency of the released beam 36 over time. The amplitude compensating means is preferably provided by a negative feedback amplifier 46 which ensures that the amplitude of the beam 36 is sustained as desired by controlling the power output to the beam 36. The oscillation amplitude of the beam 36 is negatively fed back to the amplitude compensation amplifier 46. If the oscillation amplitude starts to drop, the feedback amplifier 46 will increase the power output to the oscillating beam 36. If the oscillation amplitude increases, the feedback amplifier 46 will decrease the power output. The amplitude of the oscillating beam 36 is controlled by the amplification factor of the feedback amplifier 46.

The clock signal controlling means 40 further includes frequency locking means 50 connected to the amplitude compensating means 45 for locking on the predetermined oscillating frequency of the released beam 36. The frequency locking means 50 advantageously locks on to the resonating frequency of the on-chip oscillating beam 36. The beam 36 oscillates at its natural frequency $f_2$. A phase locked loop ("PLL") 52, is preferably used to generate a frequency $f_1$ which is a sub-harmonic frequency of $f_2$ as understood by those skilled in the art. During oscillation, the beam 36 introduces a small signal (with frequency $f_2$) at node A. This signal $f_2$ is preferably filtered from the PLL 52 generated signal ($f_1$) using a bandpass filter 53 and is amplified using a narrow band amplifier 54. This amplified signal which is at frequency $f_2$ is then reduced using a frequency divider 55 to frequency $f_1$. The PLL 52 locks on to this frequency. The output of the PLL 52 preferably supplies energy to the oscillating beam 36 every n cycles (where $n=f_2/f_1$) The first frequency $f_1$ preferably tracks the second frequency $f_2$. Hence, even if the second frequency $f_2$ changes, the energy is still supplied after the same number of cycles (n). The number of cycles after which an energy pulse has to be supplied to sustain the oscillations can advantageously be a design parameter for the oscillator 20.

The clock signal controlling means 40 can further include temperature compensating means 60 connected to the frequency locking means 50 for compensating for frequency shifting due to temperature variations and for a difference in oscillating frequency due to process variations. The temperature compensating means 60 preferably advantageously provides at least two main capabilities. First, the temperature compensating means 60 accounts for the difference in natural oscillating frequency due to process changes or variations. Second, the temperature compensating means 60 compensates for frequency shifts due to temperature variations. After final packaging, the frequency of the beam 36 is measured using an external frequency meter and coded into an electronic-erasable programmable read only memory ("EEPROM") 62 or other nonvolatile memory device. A counter 61, preferably a part of the temperature compensating means 60, is used to generate the clock pulse. The pulse is generated when the counter 61 counts to the number stored in the EEPROM 62. This ensures that the clock pulse is generated at the correct frequency.

If the temperature operation changes, the remaining part or the temperature compensating means 60 ensures proper operation. A bandgap reference voltage 64 can advantageously be used to ensure a temperature insensitive reference. The amplitude oscillating beam signal $f_2$ is passed through a frequency-to-voltage converter 65 to get a voltage equivalent. A digital-to-analog ("D/A") converter 63 provides the voltage equivalent of the calibrated frequency. At room temperature, the difference, the difference of these two voltages will be zero. The difference at a subtractor 66 between these voltages is a direct measure of the ambient temperature. Using an analog-to-digital ("A/D") converter 67, this difference from the subtractor 66 is added digitally to the calibrated frequency value before being used as the reference for the counter 61 to generate the clock pulse.

Figure 7:
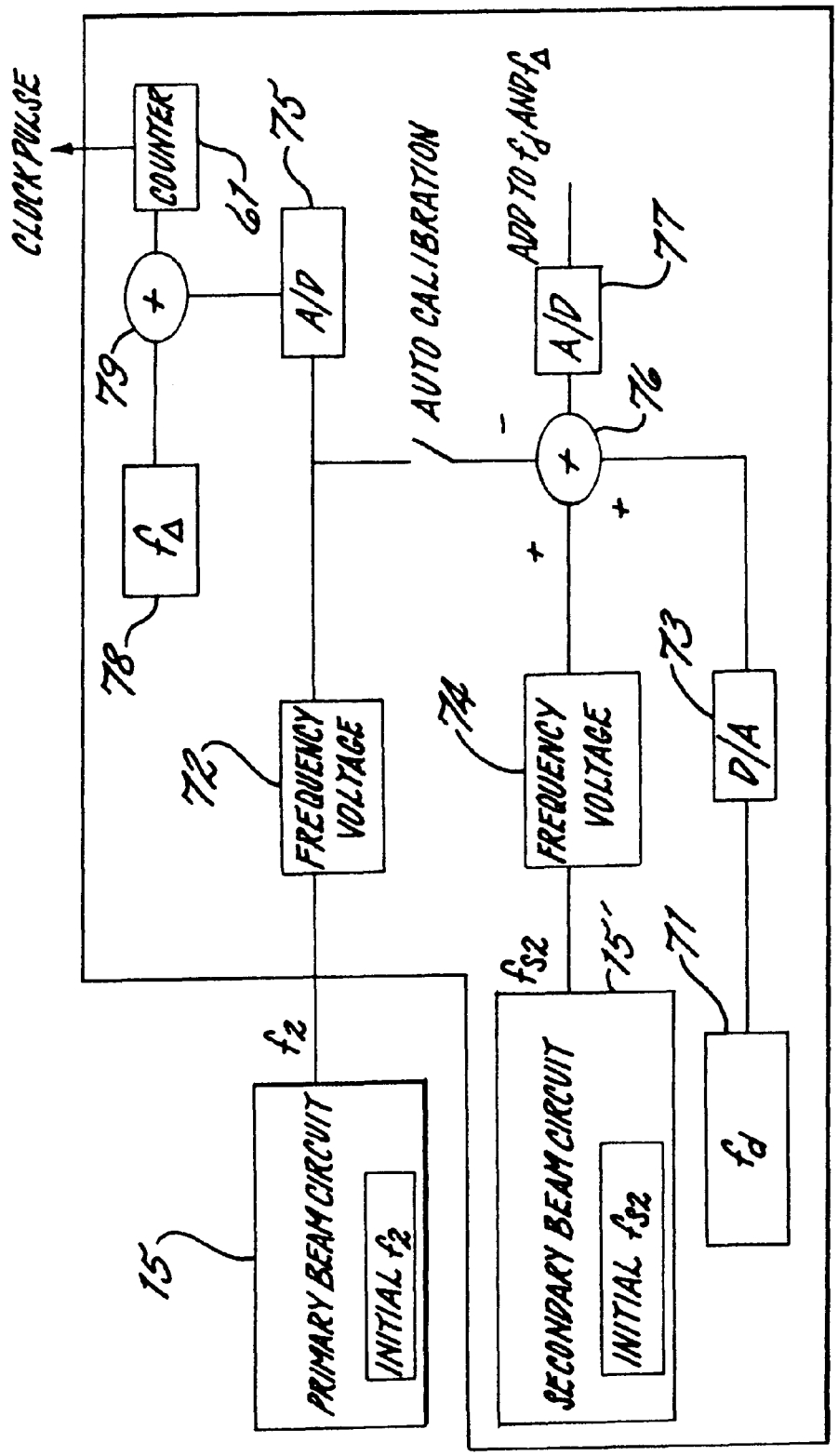
FIG. 7 is a schematic block diagram of an aging compensator of an integrated oscillator according to a fourth embodiment of the present invention.

The clock signal controlling means 40 further includes aging compensating means 70 connected to the temperature compensating means 60 for compensating for frequency drift of the oscillating frequency of the released beam 36 over time due to aging (see FIG. 7). The aging compensating means 70 preferably addresses the frequency drift with time due to the aging of the resonating beam 36. A second beam 86 is preferably used which is similar to the primary beam 36 located within the primary beam circuit 15. The secondary beam 86 has its own frequency locking, amplitude compensating, and temperature compensating circuits. The frequency of the secondary beam ($f_{s2}$) and its difference from the primary beam frequency ($fd=f_{s2}-f_2$) is also measured during calibration and coded into the EEPROM 62'. Only the primary beam 36 is oscillated on a continuing basis. The secondary beam is oscillated only when recalibration of the primary beam frequency is desired. The secondary beam does not fatigue since it is oscillated only occasionally and hence the frequency does not shift due to aging. Any change in the primary beam frequency due to aging is determined based on its shift from the secondary frequency minus the difference ($f_{s2}-fd$). This change in frequency ($f\Delta$) is measured and coded into the EEPROM 62. The reference count will now be $f_2+f\Delta$, and hence the frequency shift due to aging is thus compensated.

As perhaps best illustrated in FIG. 7, an integrated oscillator 20 for providing clock signals preferably includes first and second micro-mechanical oscillating means 30, 80 each for providing an oscillating clock signal and clock signal controlling means 40 connected to the first and second micro-mechanical oscillating means 30, 80 for controlling each of the first and second micro-mechanical oscillating means 30, 80 and for generating respective clock signals therefrom. The clock signal controlling means 40 preferably includes a first pair of electrodes 41, 42 connected to the first micro-mechanical oscillating means 30, a second pair of electrodes 48, 49 connected to the second micro-mechanical oscillating means 80, and aging compensating means 70 responsive to both the first and second micro-mechanical oscillating means 30, 80 for compensating for aging of the first micro-mechanical oscillating means 30 by using the oscillating frequency of the second micro-mechanical means 80 as a reference frequency.

As illustrated in FIGS. 1–11, the present invention also includes methods of forming an integrated oscillator 20, 20', 20". A method preferably includes providing a clock signal controlling circuit region 40 and forming a micro-mechanical oscillating region 30 connected to the clock signal controlling circuit region 40. The micro-mechanical oscillating region 30 is preferably formed by at least forming a first fixed conductive layer 33 of material on a support, e.g., a substrate 31, depositing a sacrificial layer 37 on the first conductive layer 33, depositing a second conductive layer 36 on the sacrificial layer 37, and removing at least unwanted portions 25 of the sacrificial layer 37 underlying the second conductive layer 36 to release the second conducting layer 36 and to thereby define a released beam 36 overlying the fixed conducting layer 33 for oscillating at a predetermined frequency. The released beam 36, for example, can advantageously be a released cantilever beam or can have a configuration including at least two supports 24". The step of forming the micro-mechanical oscillating region 30 can further include forming an insulating layer 32 on the support 31 prior to the step of forming the fixed conducting layer 33. The fixed conductive layer 33 is preferably formed of at least one of polysilicon and a metal, and the second conductive layer 36 is preferably formed of at least one of polysilicon and a metal.

Another method of forming an integrated oscillator 20 preferably includes providing a clock signal controlling circuit region 40 and forming a micro-mechanical oscillating region 30 connected to the clock signal controlling circuit region 40. The micro-mechanical oscillating region 30 is preferably formed by at least forming a first fixed conductive layer 33 of material on a support 31, forming a second conductive layer 36 overlying and in spaced relation from the fixed conductive layer 33 so as to define a released beam 36 for oscillating at a predetermined resonant frequency, and trimming portions 38 of the released beam 36 to reduce mass of the released beam 36 so as to tune the predetermined resonant frequency thereof.

The method can also include the micro-mechanical oscillating region 30 further including forming remaining portions 34 of a sacrificial layer 37 on the first conductive layer 33 and underlying the second conductive layer 36. The step of forming the second conductive layer 36 can include forming a plurality of openings 39 extending through the second conductive layer 36. The method can still further include removing at least unwanted portions 35 of the sacrificial layer 37 underlying the second conductive layer 36 to release the second conductive layer 36 and to thereby define the released beam 36 overlying the fixed conductive layer 33. The remaining portions 34 of the sacrificial layer 37 preferably define at least one support for the released beam 36, and the trimming step preferably includes laser trimming portions 38 of the released beam 36 adjacent the support 34. The step of removing unwanted portions 35 of the sacrificial layer 37 preferably includes isotropically etching the sacrificial layer 37.

An additional method of forming an integrated oscillator 20 preferably includes providing first and second micro-mechanical oscillating circuits 15, 15', controlling each of the first and second micro-mechanical oscillating circuits 15, 15' to generate respective clock signals therefrom, and compensating for aging of the first micro-mechanical oscillating circuit 15 responsive to the oscillating frequency of the second micro-mechanical circuit 15'.

The method can also advantageously include compensating for the amplitude variations of the predetermined oscillating frequency of each of the first and second micro-mechanical oscillating circuits 15, 15' over time. The method can further include locking on the predetermined oscillating frequency of the first and second micro-mechanical oscillating circuits 15, 15' and compensating both for frequency shifting due to temperature variations and for a difference in oscillating frequency due to process variations.

The various embodiments of the integrated oscillator 20 and its associated methods, including methods of forming the same, may also be advantageously used for other applications as well. For example, other integrated circuitry having related structures are illustrated in the following copending patent applications: (1) "Integrated Released Beam Sensor For Sensing Acceleration And Associated Methods," having attorney work docket number 18978, having U.S. Ser. No. 08/957,568, assigned to the assignee of the present invention, and the entire disclosure of which is incorporated herein by reference in its entirety; (2) "Integrated Sensor Having Plurality Of Released Beams for Sensing Acceleration And Associated Methods," having attorney work docket number 19844, having U.S. Ser. No. 08/957,809, assigned to the assignee of the present invention, and the entire disclosure of which is incorporated herein by reference in its entirety; and (3) "Integrated Released Beam, Thermo-Mechanical Sensor for Sensing Temperature Variations And Associated Methods," having attorney work docket number 18979, having U.S. Ser. No. 08/957,802, assigned to the assignee of the present invention, and the entire disclosure of which is incorporated herein by reference in its entirety.

In the drawings and specification, there have been disclosed typical preferred embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. An integrated oscillator for providing clock signals, the integrated oscillator comprising:

micro-mechanical oscillating means for providing an oscillating clock signal, said micro-mechanical oscillating means including:
a support layer,
a fixed layer positioned on said support layer,
remaining portions of a sacrificial layer positioned on portions of said fixed layer, and
an oscillating layer positioned on said remaining portions of the sacrificial layer, overlying said fixed layer in spaced relation therefrom, and extending lengthwise generally transverse to a predetermined direction for defining a released beam for oscillating at a predetermined frequency, the spaced relation formed by removal of unwanted portions of the sacrificial layer; and clock signal controlling means connected to said micro-mechanical oscillating means for controlling said micro-mechanical oscillating means and for generating clock signals therefrom.

2. An integrated oscillator as defined in claim 1, wherein said fixed layer comprises a fixed conductive layer and said oscillating layer comprises an oscillating conductive layer overlying said fixed conductive layer, and wherein said clock signal controlling means includes a first electrode connected to said fixed conductive layer and a second electrode connected to said oscillating conductive layer so that said fixed conductive layer and said oscillating conductive layer define two plates of a capacitor and generate an electric field therebetween when a voltage signal is applied to the first and second electrodes.

3. An integrated oscillator as defined in claim 1, wherein said clock signal controlling means includes amplitude compensating means connected to said micro-mechanical oscillating means for compensating for the amplitude variations of the predetermined oscillating frequency of said released beam over time.

4. An integrated oscillator as defined in claim 3, wherein said clock signal controlling means further includes frequency locking means connected to said amplitude compensating means for locking on the predetermined oscillating frequency of said released beam.

5. An integrated oscillator as defined in claim 4, wherein said clock signal controlling means further includes temperature compensating means connected to said frequency locking means for compensating for frequency shifting due to temperature variations and for a difference in oscillating frequency due to process variations.

6. An integrated oscillator as defined in claim 5, wherein said clock signal controlling means further includes aging compensating means connected to said temperature compensating means for compensating for frequency drift of the oscillating frequency of said released beam over time due to aging.

7. An integrated oscillator as defined in claim 2, wherein said clock signal controlling means includes a clock signal controlling circuit region, and the integrated oscillator further comprising said micro-mechanical oscillating means being positioned adjacent said clock signal controlling circuit region and transversely extending outwardly therefrom in a predetermined direction, wherein said released beam of said micro-mechanical oscillating means has a first predetermined length extending outwardly from said clock signal controlling circuit region, wherein said fixed conductive layer extends outwardly from said clock signal controlling circuit region a second predetermined length, and wherein the second predetermined length is greater than the first predetermined length.

8. An integrated oscillator as defined in claim 1, wherein said sacrificial layer includes at least one concave surface underlying said released beam.

9. An integrated oscillator as defined in claim 1, wherein said released beam includes a plurality of openings formed therein for assisting with removal of the unwanted portions of the sacrificial layer underlying said released beam, said plurality of openings extending from an upper surface of said released beam to a lower surface thereof.

10. An integrated oscillator as defined in claim 1, wherein said released beam includes laterally extending narrow portions and laterally extending wide portions integrally formed as a single layer with and extending outwardly from the narrow portions.

11. An integrated oscillator as defined in claim 1, wherein said released beam includes trimmed released portions thereof, said trimmed released portions defining peripheries of removed portions of said oscillating layer.

12. An integrated oscillator as defined in claim 1, wherein said released beam comprises a released cantilever beam.

13. An integrated oscillator as defined in claim 1, wherein said released beam comprises a released beam having a plurality of supports formed by said remaining portions of the sacrificial layer.

14. An integrated oscillator as defined in claim 2, wherein said fixed conductive layer comprises at least one of polysilicon and a metal, and wherein said released beam comprises polysilicon and a metal.

15. An integrated oscillator as defined in claim 1, wherein said micro-mechanical oscillating means further includes an insulating support layer underlying said fixed conducting layer, said insulating support layer comprising a nitride layer formed on a field oxide.

16. An integrated oscillator as defined in claim 1, wherein said sacrificial layer comprises an oxide layer.

17. An integrated oscillator for providing clock signals, the integrated oscillator comprising:
 micro-mechanical oscillating means for providing an oscillating clock signal, said micro-mechanical oscillating means including:
  a fixed conductive layer, and
  an oscillating conductive layer overlying said fixed conductive layer in spaced relation therefrom, and extending lengthwise generally transverse to a predetermined direction for defining a released beam for oscillating at a predetermined frequency, said released beam including a plurality of openings formed therein, said plurality of openings extending from an upper surface of said released beam to a region defining the spaced relation underlying said released beam and positioned between said released beam and said fixed conductive layer, and trimmed released portions defining peripheries of removed portions of said oscillating conductive layer; and
 clock signal controlling means connected to said micro-mechanical oscillating means for controlling said micro-mechanical oscillating means and for generating clock signals therefrom, said clock signal controlling means including a first electrode connected to said fixed conductive layer and a second electrode connected to said oscillating conductive layer so that said fixed conductive layer and said oscillating conductive layer define two plates of a capacitor and generate an electric field therebetween when a voltage signal is applied to the first and second electrodes.

18. An integrated oscillator as defined in claim 17, wherein said trimmed released portions form laterally extending narrow portions, and wherein said released beam further includes laterally extending wide portions integrally formed as a single layer with and extending outwardly from the laterally extending narrow portions.

19. An integrated oscillator as defined in claim 18, wherein said micro-mechanical oscillating means further includes remaining portions of a sacrificial layer positioned only on portions of said fixed conductive layer and underlying said released beam, the spaced relation between said fixed conductive layer and said oscillating conductive layer formed by removal of unwanted portions of said released beam.

20. An integrated oscillator as defined in claim 19, wherein said remaining portions define at least one support for said released beam, and wherein said trimmed released portions are positioned adjacent the at least one support to thereby inhibit said released beam from being subjected to excessive deflections and stress when forming said trimmed released portions.

21. An integrated oscillator as defined in claim 20, wherein said clock signal controlling means includes amplitude compensating means connected to said micro-mechanical oscillating means for compensating for the amplitude variations of the predetermined oscillating frequency of said released beam over time.

22. An integrated oscillator as defined in claim 21, wherein said clock signal controlling means further includes frequency locking means connected to said amplitude compensating means for locking on the predetermined oscillating frequency of said released beam.

23. An integrated oscillator as defined in claim 22, wherein said clock signal controlling means further includes temperature compensating means connected to said frequency locking means for compensating for frequency shifting due to temperature variations and for a difference in oscillating frequency due to process variations.

24. An integrated oscillator as defined in claim 23, wherein said clock signal controlling means further includes aging compensating means connected to said temperature compensating means for compensating for frequency drift of the oscillating frequency of said released beam over time due to aging.

25. An integrated oscillator as defined in claim 24, wherein said released beam comprises a released cantilever beam.

26. An integrated oscillator as defined in claim 24, wherein said released beam comprises a released beam having a plurality of supports formed by said remaining portions of the sacrificial layer.

27. An integrated oscillator as defined in claim 25, wherein said clock signal controlling means includes a clock signal controlling circuit region, and the integrated oscillator further comprising said micro-mechanical oscillating means being positioned adjacent said clock signal controlling circuit region and transversely extending outwardly therefrom in a predetermined direction, wherein said released beam of said micro-mechanical oscillating means has a first predetermined length extending outwardly from said clock signal controlling circuit region, wherein said fixed conducting layer extends outwardly from said clock signal controlling circuit region a second predetermined length, and wherein the second predetermined length is greater than the first predetermined length.

28. An integrated oscillator as defined in claim 27, wherein said sacrificial layer includes at least one concave surface underlying said released beam.

29. An integrated oscillator as defined in claim 28, wherein said fixed conducting layer comprises at least one of polysilicon and a metal.

30. An integrated oscillator as defined in claim 29, wherein said released beam comprises polysilicon and a metal.

31. An integrated oscillator as defined in claim 30, wherein said insulating support layer comprises a nitride layer formed on a field oxide, and wherein said sacrificial layer comprises an oxide layer.

32. An integrated oscillator for providing clock signals, the integrated oscillator comprising:

first and second micro-mechanical oscillating means each for providing an oscillating clock signal, each of said first and second micro-mechanical oscillating means including:
a fixed conductive layer positioned on said support layer,
remaining portions of a sacrificial layer on said fixed conductive layer, and
an oscillating conductive layer positioned on said remaining portions of the sacrificial layer, overlying said fixed conducting layer in spaced relation therefrom, and extending lengthwise generally transverse to a predetermined direction for defining a released beam for oscillating at a predetermined frequency; and clock signal controlling means connected to said first and second micro-mechanical oscillating means for controlling each of said first and second micro-mechanical oscillating means and for generating respective clock signals therefrom, said clock signal controlling means including a first pair of electrodes respectively connected to said fixed conductive layer and said oscillating conductive layer of said first micro-mechanical oscillating means so that said fixed conductive layer and said oscillating conductive layer thereof define two plates of a capacitor and generate an electric field therebetween when a voltage signal is applied to the first pair of electrodes and a second pair of electrodes respectively connected to said fixed conductive layer and said oscillating conductive layer of said second micro-mechanical oscillating means so that said fixed conductive layer and said oscillating conductive layer thereof also define two plates of a capacitor and generate an electric field therebetween when a voltage signal is applied to the second pair of electrodes, and aging compensating means responsive to both said first and second micro-mechanical oscillating means for compensating for aging of said first micro-mechanical oscillating means by using the oscillating frequency of said second micro-mechanical means as a reference frequency.

33. An integrated oscillator as defined in claim 32, wherein said clock signal controlling means further includes first and second amplitude compensating means respectively connected to said first and second micro-mechanical oscillating means for compensating for the amplitude variations of the predetermined oscillating frequency of corresponding first and second released beams over time.

34. An integrated oscillator as defined in claim 33, wherein said clock signal controlling means further includes first and second frequency locking means respectively connected to said first and second amplitude compensating means for locking on the predetermined oscillating frequency of the corresponding first and second released beams.

35. An integrated oscillator as defined in claim 34, wherein said clock signal controlling means further includes first and second temperature compensating means respectively connected to said first and second frequency locking means for compensating for frequency shifting due to temperature variations and for a difference in oscillating frequency due to process variations.

36. An integrated oscillator as defined in claim 35, wherein said clock signal controlling means includes a clock signal controlling circuit region, and the integrated oscillator further comprising said first and second micro-mechanical oscillating means each being positioned adjacent said clock signal controlling circuit region and transversely extending outwardly therefrom in a predetermined direction, wherein said released beam of each of said first and second micro-mechanical oscillating means has a first predetermined length extending outwardly from said clock signal controlling circuit region, wherein each of said fixed conductive layers of said first and second micro-oscillating means extends outwardly from said clock signal controlling circuit region a second predetermined length, and wherein the second predetermined length is greater than the first predetermined length.

37. An integrated oscillator as defined in claim 36, wherein said sacrificial layer includes at least one concave surface underlying said released beam.

38. An integrated oscillator as defined in claim 37, wherein said released beam includes a plurality of openings formed therein for assisting with removal of the unwanted portions of the sacrificial layer underlying said released beam, said plurality of openings extending from an upper surface of said released beam to a region defining the spaced relation underlying said released beam and positioned between said released beam and said fixed conducting layer.

39. An integrated oscillator as defined in claim 38, wherein said released beam includes laterally extending narrow portions and laterally extending wide portions integrally formed as a single layer with and extending outwardly from the narrow portions.

40. An integrated oscillator as defined in claim 38, wherein said released beam includes trimmed released portions thereof, said trimmed released portions defining peripheries of removed portions of said oscillating layer.

41. An integrated oscillator as defined in claim 39, wherein said released beam comprises a released cantilever beam.

42. An integrated oscillator as defined in claim 39, wherein said released beam comprises a released beam having a plurality of supports formed by said remaining portions of the sacrificial layer.

43. An integrated oscillator for providing clock signals, the integrated oscillator comprising:
    first and second micro-mechanical oscillating means each for providing an oscillating clock signal; and
    clock signal controlling means connected to said first and second micro-mechanical oscillating means for controlling each of said first and second micro-mechanical oscillating means and for generating respective clock signals therefrom, said clock signal controlling means including a first pair of electrodes connected to said first micro-mechanical oscillating means, a second pair of electrodes connected to said second micro-mechanical oscillating means, and aging compensating means responsive to both said first and second micro-mechanical oscillating means for compensating for aging of said first micro-mechanical oscillating means by using the oscillating frequency of said second micro-mechanical means as a reference frequency.

44. An integrated oscillator as defined in claim 43, wherein said clock signal controlling means further includes first and second amplitude compensating means respectively connected to said first and second micro-mechanical oscillating means for compensating for the amplitude variations of the predetermined oscillating frequency of corresponding first and second released beams over time.

45. An integrated oscillator as defined in claim 44, wherein said clock signal controlling means further includes first and second frequency locking means respectively connected to said first and second amplitude compensating means for locking on the predetermined oscillating frequency of the corresponding first and second released beams.

46. An integrated oscillator as defined in claim 45, wherein said clock signal controlling means further includes first and second temperature compensating means respectively connected to said first and second frequency locking means for compensating for frequency shifting due to temperature variations and for a difference in oscillating frequency due to process variations.

47. An integrated oscillator as defined in claim 35, wherein said clock signal controlling means includes a clock signal controlling circuit region, and the integrated oscillator further comprising said first and second micro-mechanical oscillating means each being positioned adjacent said clock signal controlling circuit region and transversely extending outwardly therefrom in a predetermined direction, wherein each of said first and second micro-mechanical oscillating means includes a released beam having a first predetermined length extending outwardly from said clock signal controlling circuit region and a fixed conductive layer extending outwardly from said clock signal controlling circuit region a second predetermined length, and wherein the second predetermined length is greater than the first predetermined length.

48. An integrated oscillator as defined in claim 47, wherein each of said released beams includes a plurality of openings formed therein for assisting with removal of the unwanted portions of the sacrificial layer underlying said released beams, each of said plurality of openings extending from upper surfaces of said released beams to a region defining the spaced relation underlying said released beams and positioned between said released beams and said fixed conducting layers.

49. An integrated oscillator as defined in claim 48, wherein each of said released beams includes laterally extending narrow portions and laterally extending wide portions integrally formed as a single layer with and extending outwardly from the laterally extending narrow portions.

50. An integrated oscillator as defined in claim 49, wherein each of said released beam includes trimmed released portions thereof, said trimmed released portions defining peripheries of removed portions of said oscillating layer.

51. An integrated oscillator as defined in claim 47, wherein each of said released beams comprises a released cantilever beam.

52. An integrated oscillator as defined in claim 47, wherein each of said released beams comprises a released beam having a plurality of supports formed by said remaining portions of the sacrificial layer.

53. A method of forming an integrated oscillator, the method comprising the steps of:

provid ing a clock signal controlling circuit region; and forming a micro-mechanical oscillating region connected to the clock signal controlling circuit region, the micro-mechanical oscillating region being formed by at least:

forming a first fixed conductive layer of material on a support, depositing a sacrificial layer on the first fixed conductive layer, depositing a second conductive layer on the sacrificial layer, and removing at least unwanted portions of the sacrificial layer underlying the second conductive layer to release the second conducting layer to thereby define a released beam overlying the fixed conducting layer for oscillating at a predetermined frequency.

54. A method as defined in claim 53, wherein the released beam forms a released cantilever beam.

55. Method as defined in claim 53, wherein the released beam forms a released beam overlying the first fixed conductive layer so as to have a configuration including at least two supports.

56. A method as defined in claim 50, wherein the step of forming the micro-mechanical oscillating region further comprises forming an insulating layer on the support prior to the step of forming the first conducting layer.

57. A method as defined in claim 56, wherein the first fixed conductive layer comprises at least one of polysilicon and a metal.

58. A method as defined in claim 57, wherein the second conductive layer comprises at least one of polysilicon and a metal.

59. A method of forming an integrated oscillator, the method comprising the steps of:

providing a clock signal controlling circuit region; and forming a micro-mechanical oscillating region connected to the clock signal controlling circuit region, the micro-mechanical oscillating region being formed by at least:

forming a first fixed conductive layer of material on a support, forming a second conductive layer overlying and in spaced relation from the fixed conductive layer so as to define a released beam for oscillating at a predetermined resonant frequency, and trimming portions of the released beam to reduce mass of the released beam so as to tune the predetermined resonant frequency thereof.

60. A method as defined in claim 59, herein the micro-mechanical oscillating region further includes forming remaining portions of a sacrificial layer on the first conductive layer and underlying the second conductive layer.

61. A method as defined in claim 60, wherein the step of forming the second conductive layer includes forming a plurality of openings extending through the second conductive layer, and the method further includes removing at least unwanted portions of the sacrificial layer underlying the second conductive layer to release the second conductive layer to thereby define the released beam overlying the fixed conductive layer.

62. A method as defined in claim 61, wherein the remaining portions of the sacrificial layer define at least one support for the released beam, and wherein the trimming step comprises laser trimming portions of the released beam adjacent the support.

63. A method as defined in claim 62, wherein the step of removing unwanted portions of the sacrificial layer comprises isotropically etching the sacrificial layer.

64. A method of forming an integrated oscillator, the method comprising the steps of:

providing first and second micro-mechanical oscillating circuits;

controlling each of the first and second micro-mechanical oscillating circuits to generate respective clock signals therefrom; and compensating for aging of the first micro-mechanical oscillating means responsive to the oscillating frequency of the second micro-mechanical means.

65. A method as defined in claim 64, further comprising compensating for the amplitude variations of a predetermined oscillating frequency of each of the first and second micro-mechanical oscillating circuits over time.

66. A method as defined in claim 65, further comprising locking on the predetermined oscillating frequency of the first and second micro-mechanical oscillating circuits.

67. A method as defined in claim 66, further comprising compensating both for frequency shifting due to temperature variations and for a difference in oscillating frequency due to process variations.

* * * * *